United States Patent
Nagamatsu et al.

(10) Patent No.: US 6,839,367 B2
(45) Date of Patent: Jan. 4, 2005

(54) LIGHT SOURCE COMPRISING LASER DIODE MODULE

(75) Inventors: Shinya Nagamatsu, Tokyo (JP); Kenichi Namba, Tokyo (JP); Shu Namiki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/809,074

(22) Filed: Mar. 16, 2001

(65) Prior Publication Data

US 2002/0054615 A1 May 9, 2002

(30) Foreign Application Priority Data

Nov. 8, 2000 (JP) ......................................... 2000-340597

(51) Int. Cl.[7] .............................. H01S 3/00; H01S 3/08
(52) U.S. Cl. .......................................... 372/34; 372/36
(58) Field of Search ..................................... 372/34–36

(56) References Cited

U.S. PATENT DOCUMENTS

| | | | | |
|---|---|---|---|---|
| 4,791,634 A | * | 12/1988 | Miyake | 372/34 |
| 4,820,010 A | | 4/1989 | Scifres et al. | 385/43 |
| 5,265,113 A | * | 11/1993 | Halldöorsson et al. | 372/36 |
| 5,371,753 A | * | 12/1994 | Adsett | 372/36 |
| 5,764,675 A | | 6/1998 | Juhala | 372/50 |
| 6,172,803 B1 | * | 1/2001 | Masuda et al. | 359/337.12 |
| 6,252,726 B1 | * | 1/2001 | Verdiell | 372/34 |

FOREIGN PATENT DOCUMENTS

| | | | |
|---|---|---|---|
| EP | 0268523 | 5/1988 | |
| EP | 1209783 | 5/2002 | |
| GB | 2329758 | 3/1999 | |
| JP | 60-153186 | 8/1985 | |
| JP | 63-302584 | 12/1988 | |
| JP | 04-179180 | 6/1992 | |
| JP | 05-167143 | 7/1993 | |
| JP | 05-167143 A * | 7/1993 | H01S/3/18 |
| JP | 08-116138 | 5/1996 | |
| JP | 09-181376 | 7/1997 | |
| JP | 10200208 | 7/1998 | |
| WO | WO 9836479 A1 * | 8/1998 | 359/337.12 |

* cited by examiner

*Primary Examiner*—Quyen Leung
(74) *Attorney, Agent, or Firm*—Oblon, Spivak, McClelland, Maier & Neustadt, P.C.

(57) ABSTRACT

A light source including at least one laser diode module and a heat pipe having a heat absorbing portion and a heat radiating portion. The laser diode module includes a metal substrate mounting a laser diode chip and an optical component, and a peltier device thermally connected with the metal substrate. The heat absorbing portion of the heat pipe is thermally connected with the peltier device. The light source preferably includes a plurality of densely placed laser diode modules, each of which has an output of at least 100 mW. The light source also preferably includes a plurality of heat pipes having heat radiating fins on the heat radiating portions thereof.

17 Claims, 5 Drawing Sheets

LIGHT SOURCE COMPRISING LASER DIODE MODULE

BACKGROUND OF THE INVENTION

1. Field of the Invention

The present invention relates to a high-power light source including at least one high-power laser diode module.

2. Discussion of the Background

Generally, a laser diode module is used as a signal light source for optical fiber communication, especially for a main line system or a CATV, or as an excitation light source for optical fiber amplifier. Such a laser diode module includes a peltier device in order to attain high power and stable operation. The laser diode module further includes a laser diode chip, a photo diode chip, optical components such as lenses, and electrical components such as a thermistor device or registers, which are supported by a metal substrate that is mounted on the peltier device.

The above mentioned peltier device is an electrocaloric semiconductor. When a direct current flows through the peltier device, the heat is transferred toward the direction of the electric current flow, thereby causing temperature difference between one end of the electrocaloric semiconductor and the other end thereof. A cooling system utilizing the peltier device uses the lower temperature side for cooling and the higher temperature side for heat radiation thereby making use of the above mentioned temperature difference.

The laser diode module detects the temperature of the laser diode chip by using the thermistor device bonded in the vicinity of the chip. Thus provided is a structure for cooling the entire metal substrate on which the laser diode chip is placed, and for maintaining the laser diode chip at a fixed temperature, by activating the peltier device by feeding back the detected temperature.

FIG. 4 shows a schematic sectional view of a conventional laser diode module. The laser diode module includes a metal substrate 110a on which is mounted a mount 113 supporting a laser diode chip 111 and a heat sink 112, a chip carrier 115 supporting a monitoring photo diode chip 114, and a lens holder 116. The metal substrate 110a further has resistors, inductors, circuit substrates, etc. that are bonded thereto, which are not depicted in FIG. 4. The metal substrate 110a is bonded to a peltier device 117. The peltier device is fixed on a package radiator board 118 with metal solder. Here, ceramic substrates 119A, 119B are placed on the upper and lower side of the peltier device 117.

FIG. 5 is a cross-sectional view of the laser diode module taken along line V—V in FIG. 4. As is shown in FIG. 5, in the main portion of the laser diode module, the thermistor 121 and the laser diode chip 111 are mounted on the heat sink 112. Soft solder 122 is employed as metal solder for joining the peltier device 117 and the metal substrate 110a, in order to relieve stresses caused by the difference in thermal expansion between the materials used to construct the peltier device 117 and the materials used to construct the metal substrate 110a.

The above mentioned metal substrate 110a is generally made of a single material, such as cuprotungsten (CuW: weight ratio of copper can be 10 to 30 percent). A low temperature soft solder, such as indium-tin (InSn), has been employed for bonding between the metal substrate 110a and the peltier device 117, in order to relieve stresses caused by the difference in thermal expansion between the materials used to construct the peltier device 117 and the materials used to construct the metal substrate 110a.

However, in recent years, the requirement for cooling ability and the temperature environment reliability (i.e., the ability to maintain regular function even if the temperature changes) of the laser diode module is becoming more challenging, as the power of the laser diode module is increased, thereby increasing the amount of heat generated by the laser diode module.

Possible solutions to the above problem include enlarging the size of the peltier device or employing a material with high thermal conductivity in order to enhance the cooling ability. However, such changes in configuration cause an increase in temperature stress to the metal substrate mounted above the peltier device, because of the shortening of the temperature controlling time (i.e., the time needed to reach a target temperature) entailed by the enhancement of the cooling ability of the peltier device. Therefore, there exists a problem in that the influence of the difference in thermal expansion coefficients between the peltier device and the metal substrate is enhanced or increased, thereby causing cracking and peeling off to occur due to the vibration of the soft solder bonding them. Accordingly, since the phenomenon of solder creep (which is typical for soft solder) becomes significant in such a configuration, it becomes necessary to employ a low temperature hard solder, such as a bismuth-tin (BiSn), as solder for bonding the peltier device and the metal substrate.

In order to resolve the above-mentioned problem, a semiconductor laser module having a metal substrate consisting of two kinds of metals is described in Japanese Patent Application Laid-open No. Hei 10-200208. The semiconductor laser module is illustrated in FIGS. 6A and 6B. As is shown in FIG. 6A, the semiconductor laser module is fabricated by bonding a metal substrate 210 and a peltier device 207 with hard solder 212. The substrate 210 has mounted thereon an LD chip 201, a thermistor 211 for keeping the temperature of the LD chip 201 constant, a heat sink 202, and a sub-mount 203. The peltier device is provided with ceramic substrates 209A, 209B at its top and bottom, respectively.

The metal substrate 210 is bonded to the upper surface of the peltier device in a direction perpendicular to a direction of heat flow from the LD chip 201 to the peltier device 207. The metal substrate 210 is constructed such that a first metal member 213 is positioned at a central portion of the substrate, which includes a portion underneath the LD chip 201. The metal substrate 210 also includes a second metal member 214 is placed on the sides surrounding the first metal member 213, as depicted in FIG. 6B. Further, the first metal member 213 of the metal substrate 210 is composed of a metal material with high thermal conductivity and the second metal member 214 is composed of a material with lower thermal conductivity compared to that of the first metal member 213. The metal substrate 210 is expected to reduce the thermal expansion of the entire metal substrate, to improve the thermal conductance, and to improve the cooling ability, thereby increasing the reliability of the peltier device.

The laser diode module depicted in FIGS. 6A and 6B is intended to improve the cooling ability of the peltier device and heighten the reliability of the peltier device. However, if the output power of the laser diode module is increased and if such laser diode modules are used in large numbers in highly dense placement, then there exists a problem that the function of the laser diode module is damaged. Under such conditions it becomes impossible to manage the heat generated by the enhancement of the output power of the laser diode modules and the dense placement of the laser diode modules merely by increasing the thermal conductivity of the metal substrate placed between the chip and the peltier device, and by decreasing the difference in thermal expansion coefficients between them.

As each laser diode module is small in size, and as each module act as a high density heat element, it is difficult to release the heat of the laser diode modules when the laser diode modules are used as a light source for optical excitation or as a light source for optical signals where it is necessary to mount a plurality of laser diode modules. As high power is required for the light source for optical excitation or the light source for optical signals, and as the cooling ability of the peltier device has reached an upper limit of efficiency in the conventional laser diode module configurations, semiconductor laser devices utilizing conventional modules are forced to operate in an inefficient manner below their full abilities.

In addition, there is a desire in the market to maintain the electric power consumption in operating the peltier device and the semiconductor device at or below current levels, while the optical output is improved.

Accordingly, there is a need for an improved high-power light source that overcomes the problems identified above.

SUMMARY OF THE INVENTION

Accordingly, the present invention advantageously provides alight source comprising at least one high-power laser diode module that resolves the problems described above. The present invention provides a high-power light source that preferably includes a plurality of high-power and densely placed laser diode modules without the drawbacks described above.

The inventors of the present invention have conducted extensive research to solve the problems described above. As a result of the research, the present inventors have discovered that it is possible to reduce the risk of breakdown of the peltier device, to heighten the output power of the laser diode modules, and to successfully deal with a dense placement of the laser diode modules by connecting a heat pipe having a high thermal conductivity. Preferably, the heat pipe has a thermal conductivity at least twenty times higher than that of a single crystal diamond.

The inventors discovered that each of the laser modules can be cooled down with excellent efficiency, which was not attained using conventional methods of cooling. Accordingly, a reliable and high-power light source comprising a plurality of laser diode modules is provided by the present invention by thermally connecting a heat absorbing portion of the heat pipe to each of the laser diode modules, which comprise a metal substrate mounting a laser diode chip and an optical component, and a peltier device thermally connected to the metal substrate. Such a light source is reliable even when a large amount of laser diode modules having high optical output are densely placed within the light source.

The present invention is obtained based on the above mentioned findings, and a first aspect of a light source according to the present invention is a light source comprising a plurality of high-power laser diode modules that are placed with high density.

A second aspect of the light source according to the present invention is a light source comprising laser diode modules, wherein each of the laser diode modules comprises a metal substrate mounting a laser diode chip and an optical component and a peltier device thermally connected with the metal substrate and a heat absorbing portion of a heat pipe having the heat absorbing portion and a heat radiating portion is thermally connected with the peltier device.

A third aspect of the light source according to the present invention is a light source comprising laser diode modules, wherein the heat pipe is thermally connected with each of the laser diode modules.

A fourth aspect of the light source according to the present invention is a light source comprising laser diode modules, wherein holes for receiving the heat pipes are provided on a mounting portion mounting the plurality of laser diode modules along the lengthwise direction of the laser diode modules and the laser diode modules are thermally connected with the heat pipes received in the holes.

A fifth aspect of the light source according to the present invention is a light source comprising laser diode modules, wherein the heat pipe is a circular-type heat pipe and a heat radiating fin is provided on the heat radiating portion of the circular-type heat pipe.

Another aspect of the light source according to the present invention is a light source comprising laser diode modules, wherein a bottom portion of the laser diode module includes a curved surface portion and the circular-type heat pipe is tightly connected with the curved surface portion.

Another aspect of the light source according to the present invention is a light source comprising laser diode modules, wherein another heat radiating fin is provided on a bottom surface of the mounting portion.

Another aspect of the light source according to the present invention is a light source comprising laser diode modules, wherein the light source is a light source for optical excitation used in an optical transmission system.

Another aspect of the light source according to the present invention is a light source comprising laser diode modules, wherein the light source is a light source for optical signal used in an optical transmission system.

An aspect of a Raman amplifier according to the present invention is a Raman amplifier utilizing the above light source comprising laser diode modules.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

The present invention will now be described with reference to preferred embodiments that provide advantageous structures that overcome the problems identified by the inventors, which are described above.

Figure 1:
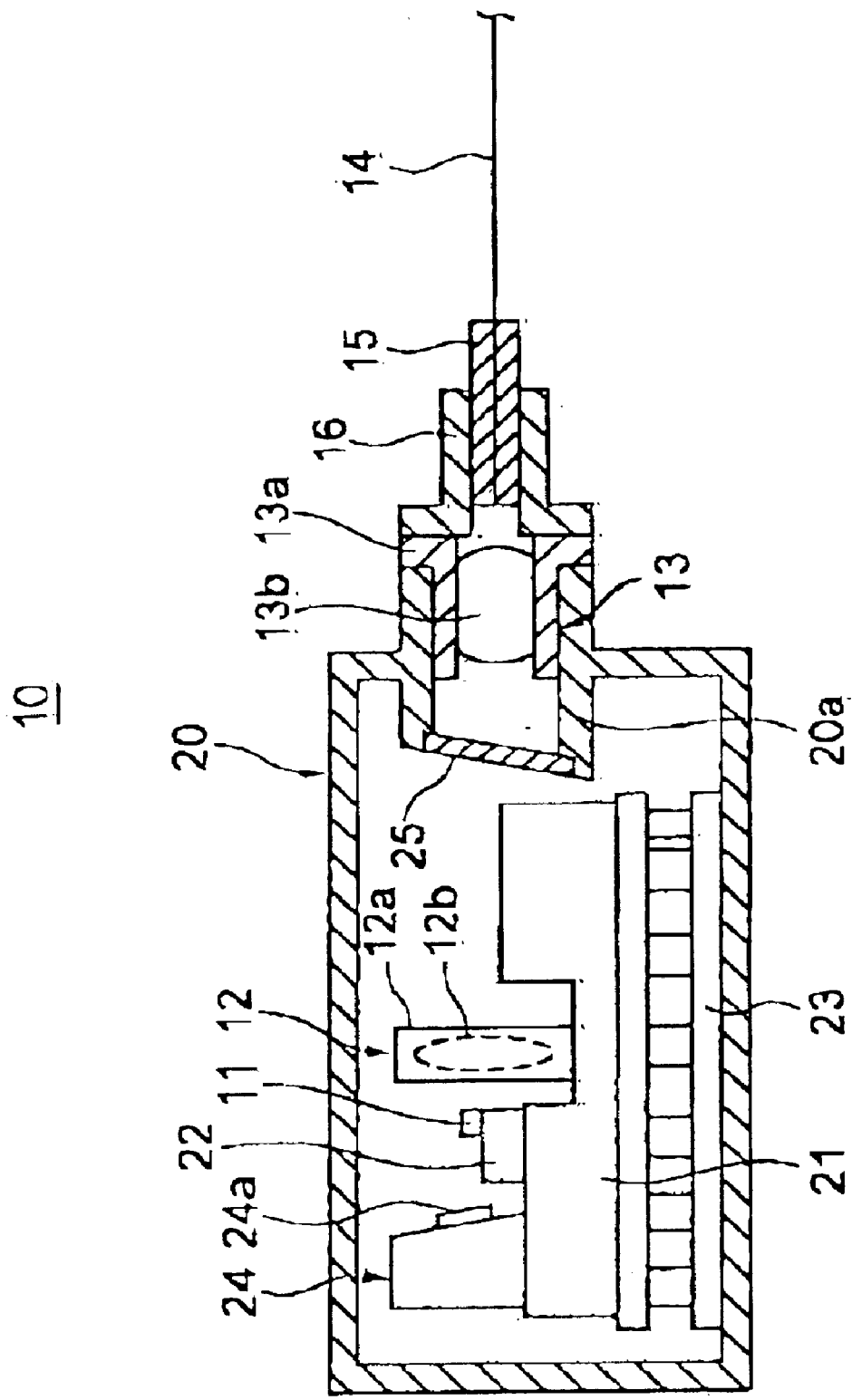
FIG. 1 is a partial cross-sectional view of a laser diode module of a light source according to the present invention.

Referring now to the drawings, FIG. 1 depicts a preferred embodiment of a laser diode module that constitutes the light source according to the present invention. As is shown in FIG. 1, a laser diode module 10 comprises a semiconductor laser 11, a first lens 12, a second lens 13, a core enlarged fiber and a hermetic case 20. The semiconductor laser 11 is provided on a base 21 via a chip carrier 22, while keeping a predetermined distance from the first lens 12. The base 21 is placed above a peltier device that is provided in the hermetic case 20 for controlling the temperature of the module 10. The main part of the base 21 is preferably made of copper, and a portion the base 21 where the first lens 12 is placed is preferably made of a composite material of a stainless alloy, for example a stainless steel alloy. A carrier 24 is fixed to a side opposite to the first lens 12 with the chip carrier 22 interposed therebetween, and a monitoring photo diode 24 is provided on a position opposing to the semiconductor laser 11 on the carrier 22.

The first lens 12 comprises a collimator lens 12b supported by a lens holder 12a. The lens holder 12a is welded and fixed to the base 21. An aspherical lens is employed for the collimator lens 12b in order to obtain excellent coupling efficiency. The second lens 13 comprises a spherical lens scraped off at its lower and upper parts and sustained by a lens holder 13a. The lens holder 13a is fixed to an insertion cylinder 20a, which will be described below, of the hermetic case 20 with its location adjusted in a plane perpendicular to the optical axis.

The front of the core-enlarged fiber 14 where the core is enlarged is obliquely polished with an angle of 6 degree against the optical axis and the polished surface thereof is coated with reflection preventing coating. The front of the fiber is protected by being adhered to the inside of a metal cylinder 15. The metal cylinder 15 is welded and fixed to an adjusting member 16 at the optimal position. The metal cylinder 15 is adjusted to the optimal position by sliding it forward and backward along the optical axis direction of the core-enlarged fiber 14 or rotating it around the optical axis of the same in the adjusting member 16.

Figure 2A:
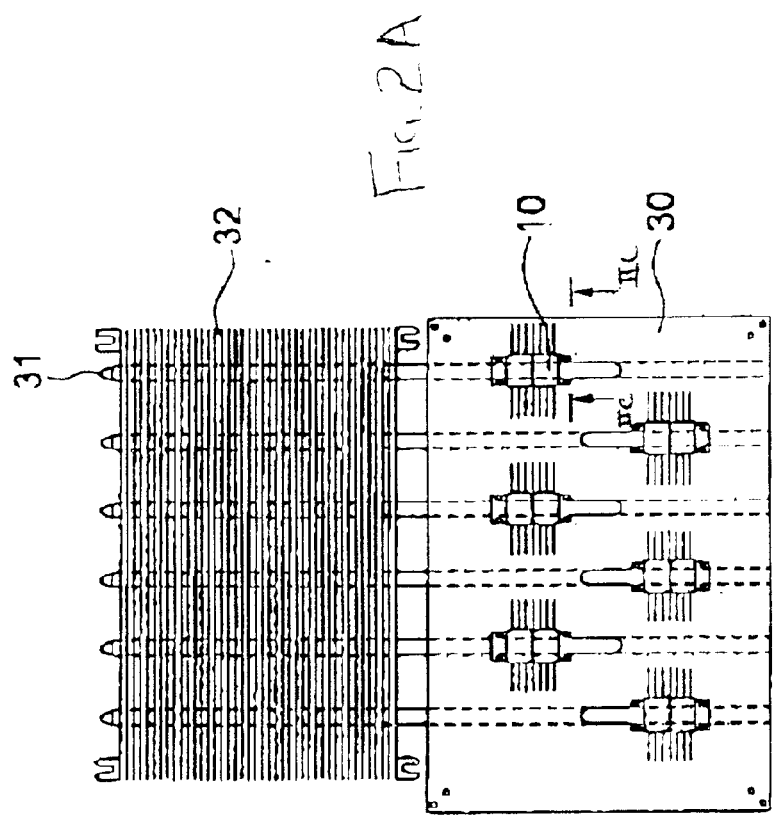
FIG. 2A is a top view of a light source comprising laser diode modules according to the present invention.
Figure 2B:
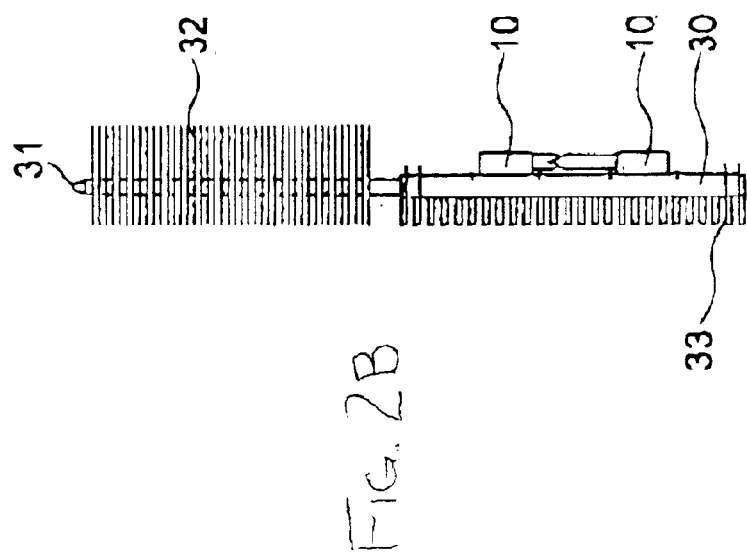
FIG. 2B is a left side view of the light source depicted in FIG. 2A.
Figure 2C:
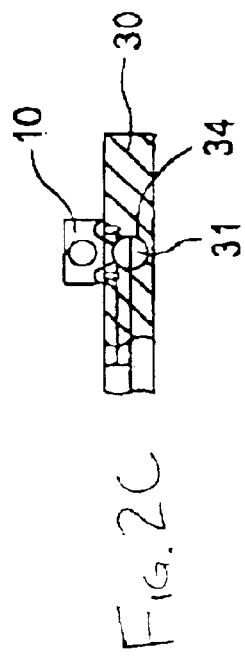
FIG. 2C is a partial cross-sectional view of the light source depicted in FIG. 2A taken along line IIC—IIC.
Figure 3B:
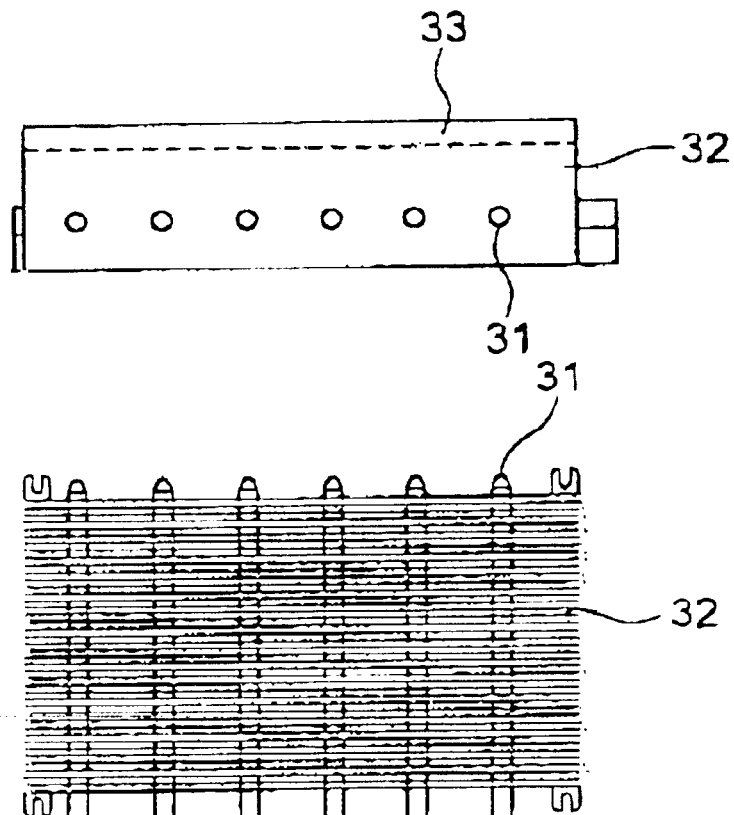
FIG. 3B is a rear view of the light source depicted in FIG. 3A.
Figure 3A:
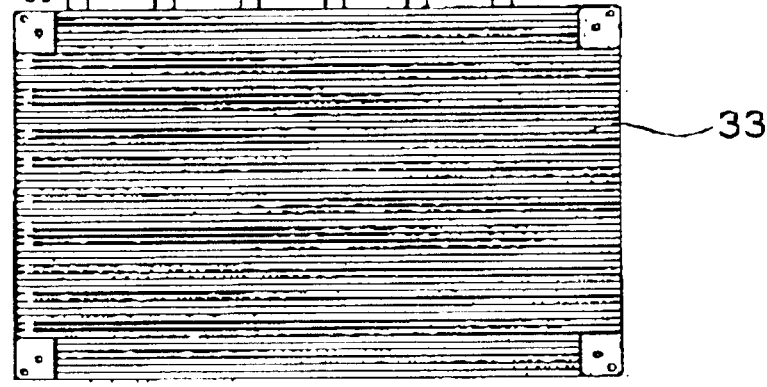
FIG. 3A is a bottom view of the light source depicted in FIG. 2A.
Figure 3C:
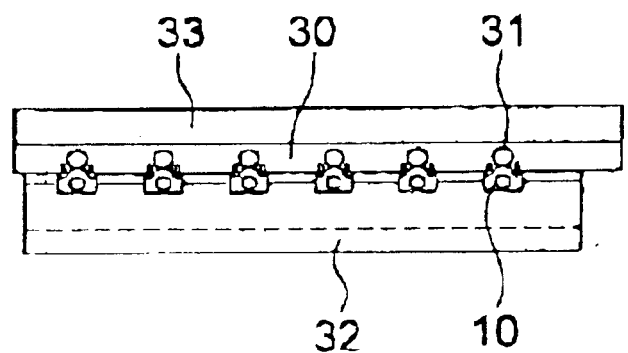
FIG. 3C is a front view of the light source depicted in FIG. 3A.
Figure 4:
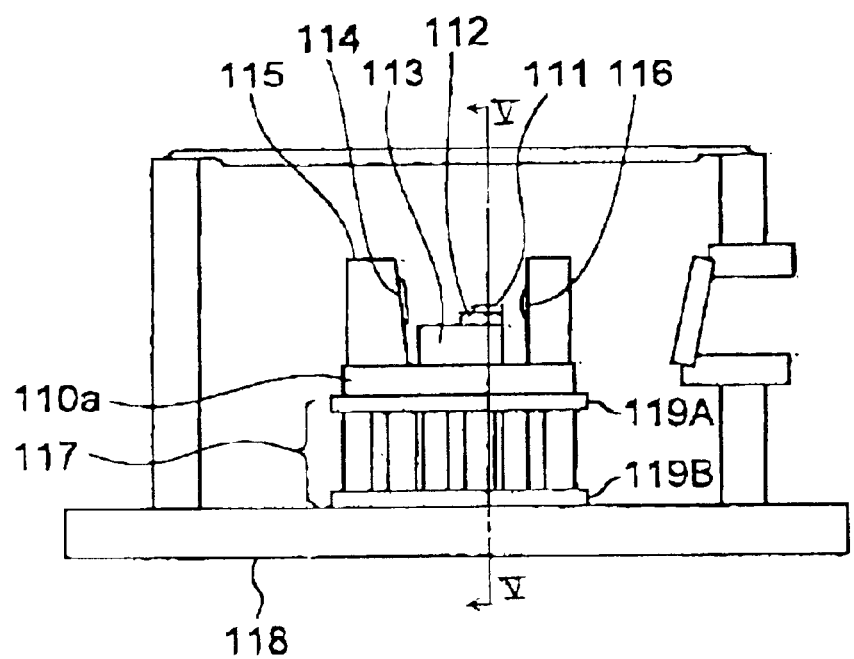
FIG. 4 is a schematic diagram depicting a conventional laser diode module.
Figure 5:
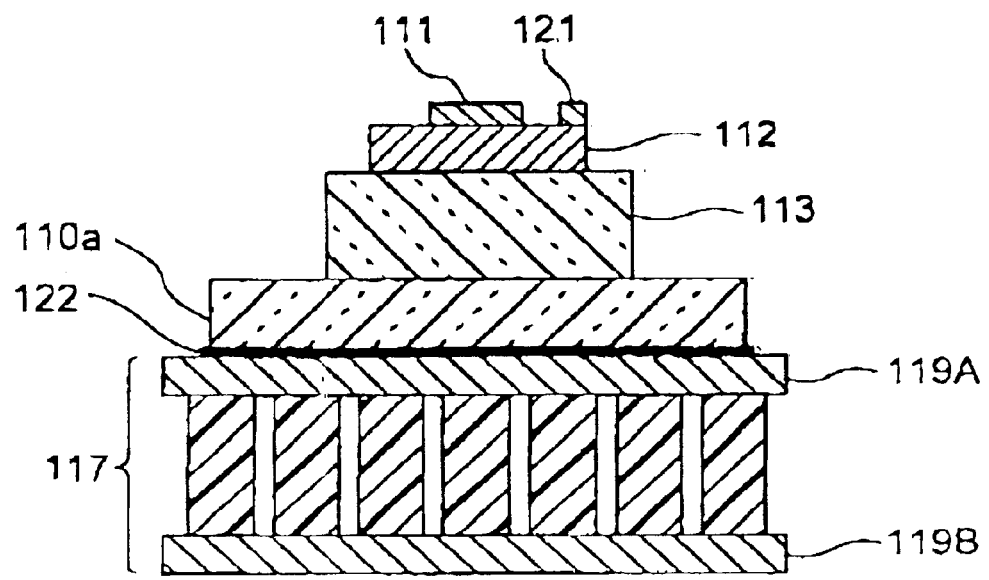
FIG. 5 is a cross-sectional view of the laser diode module depicted in FIG. 4 taken along line V—V.
Figure 6A:
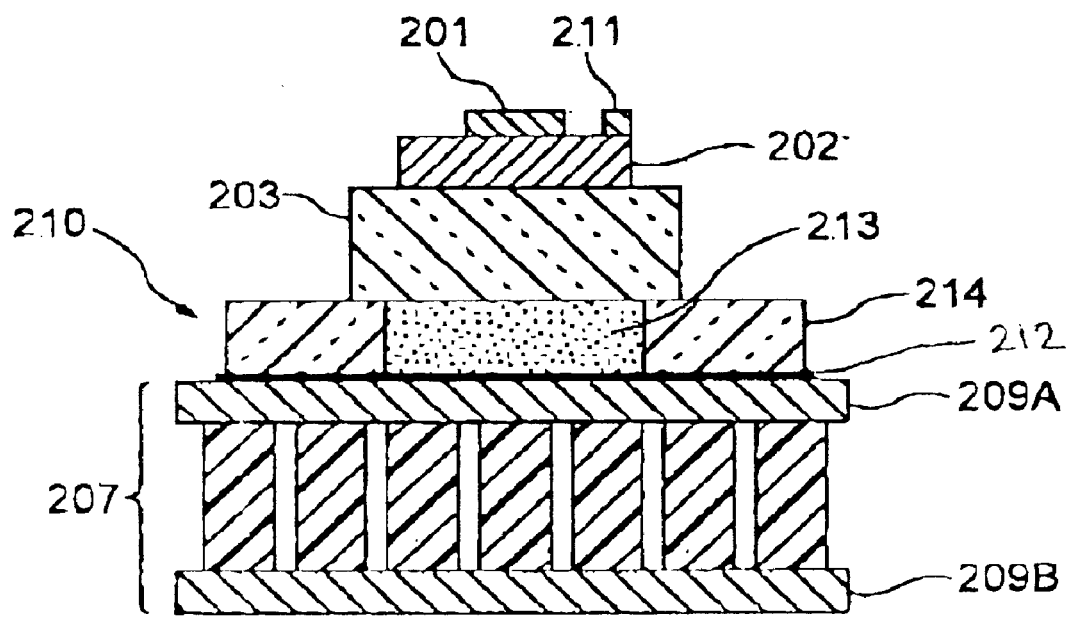
FIG. 6A is a cross-sectional view of an additional conventional semiconductor laser module having a metal substrate composed of two kinds of metal materials.
Figure 6B:
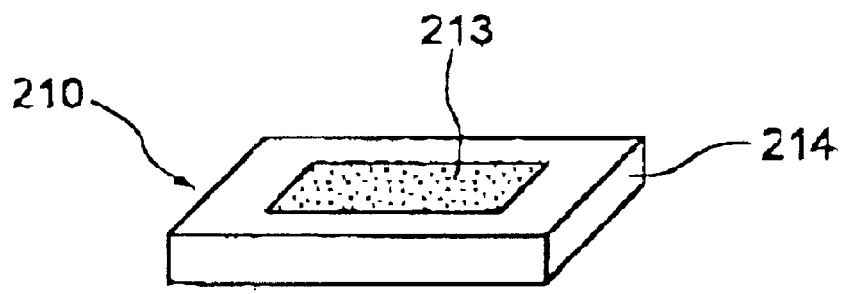
FIG. 6B is a perspective view of the metal substrate of the conventional semiconductor laser module depicted in FIG. 6A.

FIGS. 2A through 2C are diagrams showing the light source comprising laser diode modules according to the present invention. FIG. 2A is a plan view of an aspect of the light source comprising laser diode modules. FIG. 2B is a side view of the aspect of the light source comprising laser diode modules. FIG. 2C is a partial cross-sectional view along line IIC—IIC in FIG. 2A. FIGS. 3A through 3C are backside views of an aspect of the light source comprising laser diode modules. FIG. 3A is a backside view of the aspect of the light source. FIG. 3B is a side view of the aspect of the light source viewed from the heat radiating fin side. FIG. 3C is a side view of the aspect of the light source viewed from the mounting portion side.

As is shown in FIG. 2A, in this embodiment, six laser diode modules 10 are placed on a mounting portion 30 in a direction parallel to the minor axis of the mounting portion. The laser diode modules 10 are placed at predetermined intervals, and there are provided two sets or rows of laser diode module groups, each set comprising three laser diode modules arranged in the direction parallel to the major axis of the mounting portion. By placing the laser diode modules 10 in a staggered manner, highly dense placement of the laser diode modules becomes possible.

The density of placement of the laser diode modules can be heightened as long as the placement is physically possible. In other words, it is possible to arrange the laser diode modules in any manner, for example the laser diode modules can be oriented in perpendicular directions on a horizontal plane.

A heat absorbing portion of a heat pipe 31 is placed on the mounting portion 30 and heat radiating fins 32 are provided on a heat radiating portion of the heat pipe.

The heat pipe generally comprises a container having a sealed cavity, and the heat is transferred by phase change and movement of working liquid or working fluid contained in the cavity. Although the heat is partially transferred by the heat pipe via direct conduction within the material constituting the container of the heat pipe, most of the heat is transmitted by phase change and movement of the working liquid. The working liquid is evaporated at the heat absorbing side of the heat pipe where a cooling parts are attached. The working liquid evaporates due to the heat transmitted within the material of the container of the heat pipe, and the vapor moves toward the heat radiating side of the heat pipe. At the heat radiating side, the vapor of the working liquid is cooled down with aid of the fins 32 and returns to the liquid phase state. The working liquid that has returned to the liquid phase moves toward the heat absorbing side again. The transmission of the heat is accomplished by such phase transition and movement of the working liquid. The heat pipe 31 can be a cylindrical-type heat pipe or alternatively can be constructed having some other shape.

In the light source comprising laser diode modules according to the present invention, the heat pipe 31 is thermally connected with each of the laser diode modules 10, as is shown in FIG. 2A. Each of the laser diode modules comprises a metal substrate 21 mounting a laser diode chip 1 and an optical component 12, and a peltier device 23 thermally connected with the metal substrate 21. A heat absorbing portion of a heat pipe 31 is thermally connected with the peltier device 23.

FIG. 2C is a partial cross-sectional view along line IIC—IIC in FIG. 2A, as mentioned above. As is shown in FIG. 2C, in the light source comprising laser diode modules according to the present invention, holes 34 for receiving the heat radiating portions of the heat pipes 31 are provided in the mounting portion 30, where the above mentioned plurality of laser diode modules are mounted along a lengthwise direction of the laser diode module, and the heat pipes 31 received in the holes 34 are thermally contacted with the laser diode modules.

The holes 34 that receive the heat pipes 31 are formed, and inner surfaces of the holes are plated with a metal having a good wettability with the solder, such as tin or gold. The surfaces of the heat pipes 31 inserted in the holes 34 are plated with the same metal as mentioned above which is suitable for solder bonding. The heat pipes 31 plated in such a manner are inserted into the holes 34 and are soldered. As a result, an air layer, which increases a heat transfer resistance, is completely removed, thereby reducing the heat transfer resistance. Here, if even a minimal air layer remains between the heat pipe and the hole, an adiabatic layer is formed locally and the heat transfer resistance becomes higher, thereby decreasing the heat transfer ability of the heat pipe significantly.

Further, in the light source comprising laser diode modules according to the present invention, a bottom portion of each laser diode module includes a curved surface portion and the cylindrical-type heat pipe is tightly connected to the curved surface portion. As is shown in FIG. 3C, the laser diode module 10 is processed such that the bottom portion of the laser diode module can be inserted to the inner part of the mounting portions 30, and the bottom portion is provided with the curved surface portion. Therefore, the bottom portion of the laser diode module 10 is tightly connected with the surface of the heat pipe 31 that is inserted into the mounting portion 30 in a manner that brings the bottom portion of the laser diode module into direct contact with the surface of the heat pipe 31.

In implementing the mounting of the laser diode module, it is preferable that the center portion of the laser diode module is located at the nearest position where the heat pipe is embedded. As a result, the heat radiated from the laser diode module can be transferred to the heat pipe with an excellent efficiency.

FIG. 2B is, as mentioned above, a side view of the light source comprising laser diode modules according to the present invention. As is shown in FIG. 2B, additional heat radiating fins 33 are provided on the back surface (namely, the bottom surface) of the mounting portion 30 on which a plurality of laser diode modules are mounted. In this way, by providing additional heat radiating fins on the bottom surface of the mounting portion, the main part of the heat generated by the densely placed laser diode modules is transferred toward the heat radiation side by the heat pipe 31 and released into the atmosphere by the heat radiating fins 32 and another part of the heat is released into the atmosphere directly by the additional fins 33 arranged on the bottom surface of the mounting portion. Accordingly, even when the optical output of each of the laser modules increases, and, moreover, the high-power laser diode modules are placed with high density, the heat of the laser diode modules can be radiated efficiently and the laser diode chip 11 can be kept within a predetermined temperature range and the capability of the light source can be maintained without destroying the peltier device placed in the laser diode module or deteriorating the performance of the laser diode chip 11.

Aluminum is preferable material for the mounting portion.

A cylindrical-type heat pipe having a circular cross-sectional shape is preferable for the heat pipe and water can be used as the working liquid thereof. Alternatively, the cross-sectional shape of the heat pipe can be elliptical or some other compressed shape, etc. A wick can be provided in the heat pipe, in order to facilitate the flow-back of the working liquid.

The light source comprising laser diode modules according to the present invention can be used as a light source for optical excitation in an optical transmission system. And the light source comprising laser diode modules according to the present invention can be used as a light source for optical signal in the signal transmission system.

Further, a Raman amplifier according to the present invention is a Raman amplifier using the light source comprising laser diode modules according to the present invention.

The light source comprising laser diode modules according to the present invention will now be described through an additional preferred embodiment.

A mounting portion made of aluminum and having a length of 130 mm, a width of 190 mm and a height of 20 mm was fabricated. Holes for receiving heat pipes were provided on the center portion in the height direction of the mounting portion. The holes were formed in the lateral direction of the mounting portion with an interval of 28 mm. The inner surfaces of the holes were plated with tin. The surfaces of the heat pipes inserted to the holes 34 were plated with the same metal as above which was suitable for soldering, in advance. Circular-type heat pipes each having an outer diameter of 6.35 mm and made of copper were fabricated and the surfaces of the portions of the heat pipes, which were inserted to the holes, were plated by tin. Next, the heat radiating portions of the heat pipes were inserted to the holes and the heat pipes were bonded to the mounting portion by soldering.

Here, concave portions in which the bottom portions of the laser diode modules were to be received were provided at portions of the upper surface of the mounting portion where the laser diode modules were to be provided. Curved surface portions were provided on the bottom portions of the laser diode modules, and as shown in FIG. 2C, the bottom portions of the laser diode modules were directly adhered to the outer surfaces of the heat pipes via heat conducting grease.

Board-type heat radiating fins each having a length of 180 mm and a width of 40 mm and a height of 0.3 mm, as is shown in FIG. 2A were attached to the heat radiating portions of the circular-type heat pipes extending in parallel with the lateral direction of the mounting portion from the mounting portion on which laser diode modules are placed in the above mentioned manner.

Further, corrugated fins each having a height of 11 mm and a pitch of 3 mm were metallically adhered to the mounting portion on the side opposite to the laser diode modules (i.e., bottom side) with brazing (soldering).

Here, six laser diode modules were placed on the mounting portion, as is shown in FIG. 2A. The optical output of each of the laser diode modules was 100 mW or more.

Inside the heat pipes, water was sealed as a working liquid and wire-type wicks were placed.

The light source comprising laser diode modules fabricated in the above mentioned manner was operated, and an output as high as 200 mW was obtained. At this operating condition it was possible to maintain the temperature of the laser diode modules within a range of 24.9 to 25.1° C.

As mentioned above, as the heat pipes are metallically adhered to the mounting portion in the way that brings the cylindrical-type heat pipes into direct contact with the bottom portions of the laser diode modules, an excellent heat radiating property is obtained. Accordingly, a light source for optical signal or light source for optical excitation that is compact and high-power can be obtained while keeping the electric power consumption at a low level.

As mentioned above, with the present invention, a light source comprising a plurality of high-power laser diode modules placed in high density can be obtained and a light source for optical signal or light source for optical excitation that is compact and high-power can be obtained while keeping the electric power consumption at a low level, and the industrial utility of the present invention can be said to be very high.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed is:

1. An optical transmission system comprising a light source configured to produce an optical signal, said light source comprising a plurality of densely placed laser diode modules, each of said plurality of densely placed laser diode modules being mounted on a peltier device that is mounted on a mounting portion, each of said plurality of densely placed laser diode modules having an output of at least 100 mW, and a plurality of heat pipes thermally connected to said mounting portion, said plurality of heat pipes having a heat absorbing portion and a heat radiating portion with heat radiating fins.

2. An optical transmission system comprising a light source configured to produce an optical signal, said light source comprising:
   a plurality of laser diode modules including a metal substrate mounting a laser diode chip and an optical component, and a peltier device thermally connected with said metal substrate; and
   a plurality of heat pipes having a heat absorbing portion and a heat radiating portion with heat radiating fins, said heat absorbing portion of said heat pipe being thermally connected with said peltier device, each of said plurality of heat pipes being thermally connected with a respective one of said plurality of laser diode modules.

3. The optical transmission system according to claim 2, further comprising heat radiating fins provided on heat radiating portions of said plurality of heat pipes.

4. The optical transmission system according to claim 2, wherein each heat pipe of said plurality of heat pipes is cylindrical in shape.

5. A light source, comprising:
   a plurality of laser diode modules each including a metal substrate mounting a laser diode chip and an optical component, and a peltier device thermally connected with said metal substrate;
   a plurality of heat pipes each having a heat absorbing portion and a heat radiating portion, said heat absorbing portion being thermally connected with said peltier device, said plurality of heat pipes being thermally connected with said plurality of laser diode modules; and
   a mounting portion having said plurality of laser diode modules mounted thereon, said mounting portion having holes configured to receive heat absorbing portions of said plurality of heat pipes along a lengthwise direction of said respective one of said plurality of laser diode modules, said respective one of said plurality of laser diode modules being thermally connected with a respective one of said plurality of heat pipes received in said holes.

6. An optical transmission system comprising a light source configured to produce an optical signal, said light source comprising:
   a plurality of laser diode modules each including a metal substrate mounting a laser diode chip and an opical component, and a peltier device thermally connected with said metal substrate; and
   a heat pipe having a heat absorbing portion and a heat radiating portion with heat radiating fins, said heat absorbing portion of said heat being thermally connected with said peltier device,
   wherein said heat pipe is cylindrical in shape,
   wherein at least one laser diode module of said plurality of laser diode modules has a bottom portion that includes a curved surface portion, and
   wherein said heat pipe is tightly connected to said curved surface portion.

7. A light source, comprising:
   at least one laser diode module including a metal substrate mounting a laser diode chip and an optical component, and a peltier device thermally connected with said metal substrate;
   a heat pipe having a heat absorbing portion and a heat radiating portion with heat radiating fins, said heat absorbing portion of said heat pipe being thermally connected with said peltier device;
   a mounting portion having said laser diode module mounted thereon; and
   a plurality of heat radiating fins provided on a bottom surface of said mounting portion.

8. An optical transmission system comprising a Raman amplifier comprising a light source configured to produce an optical signal, said light source including a plurality of densely placed laser diode modules, each of said plurality of densely placed laser diode modules being mounted on a peltier device that is mounted on a mounting portion, each of said plurality of densely placed laser diode modules having an output of at least 100 mW, and a plurality of heat pipes thermally connected to said mounting portion, said plurality of heat pipes having a heat absorbing portion and a heat radiating portion with heat radiating fins.

9. An optical transmission system comprising a light source configured to produce an optical signal, said light source comprising:
   a laser diode module including a laser diode chip, an optical component, and a peltier device, said laser diode chip and said optical component being supported by said peltier device;
   a mounting portion having said peltier device mounted thereon such that said peltier device is thermally connected with said mounting portion;
   at least one heat pipe having a first portion extending within said mounting portion and a second portion with heat radiating fins extending from a side of said mounting portion, said heat pipe having an interior with a heat transfer fluid therein; and
   a plurality of heat radiating fins provided on a bottom surface of said mounting portion.

10. The optical transmission system according to claim 9, wherein said mounting portion is made of a metal.

11. The optical transmission system according to claim 9, further comprising a plurality of densely placed laser diode modules, each of said plurality of densely placed laser diode modules having an output of at least 100 mW.

12. The optical transmission system according to claim 9, further comprising a plurality of laser diode modules each including a metal substrate mounting a laser diode chip and an optical component, and a peltier device thermally connected with said metal substrate.

13. The optical transmission system according to claim 12, further comprising a plurality of heat pipes, each of said plurality of heat pipes being thermally connected with a respective one of said plurality of laser diode modules.

14. The optical transmission system according to claim 9, wherein said heat pipe is cylindrical in shape.

15. A light source comprising:

a plurality of laser diode modules each including a laser diode chip, an optical component, and a peltier device, said laser diode chip and said optical component being supported by said peltier device, each laser diode module including a metal substrate mounting said laser diode chip and said optical component, and said peltier device being thermally connected with said metal substrate;

a mounting portion having said peltier devices mounted thereon such that said peltier devices are thermally connected with said mounting portion; and a plurality of heat pipes each having a heat absorbing portion extending within said mounting portion and a heat radiating portion extending from a side of said mounting portion, said plurality of heat pipes each having an interior with a heat transfer fluid therein, said plurality of heat pipes being thermally connected with said plurality of laser diode modules, wherein said mounting portion has holes configured to receive heat absorbing portions of said plurality of heat pipes along a lengthwise direction of said respective one of said plurality of laser diode modules, said respective one of said plurality of laser diode modules being thermally connected with a respective on of said plurality of heat pipes received in said holes.

16. The optical transmission system according to claim 14, wherein said laser diode module has a bottom portion that includes a curved surface portion, wherein said heat pipe is tightly connected to said curved surface portion.

17. A light source comprising:

a laser diode module including a laser diode chip, an optical component, and a peltier device, said laser diode chip and said optical component being supported by said peltier device;

a mounting portion having said peltier device mounted thereon such that said peltier device is thermally connected with said mounting portion;

at least one heat pipe having a first portion extending within said mounting portion and a second portion with heat radiating fins extending from a side of said mounting portion, said heat pipe having an interior with a heat transfer fluid therein; and a plurality of heat radiating fins provided on a bottom surface of said mounting portion.

* * * * *